United States Patent
Aoki et al.

(10) Patent No.: US 10,325,825 B2
(45) Date of Patent: Jun. 18, 2019

(54) SEMICONDUCTOR APPARATUS

(71) Applicant: Mitsubishi Electric Corporation, Tokyo (JP)

(72) Inventors: Nobuchika Aoki, Tokyo (JP); Rei Yoneyama, Tokyo (JP); Akira Goto, Fukuoka (JP); Akihiko Yamashita, Hyogo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/921,704

(22) Filed: Mar. 15, 2018

(65) Prior Publication Data
US 2019/0103329 A1    Apr. 4, 2019

(30) Foreign Application Priority Data

Sep. 29, 2017 (JP) .................. 2017-190984

(51) Int. Cl.
*H01L 23/055* (2006.01)
*H01L 23/49* (2006.01)
*H01L 23/10* (2006.01)
*H01L 23/06* (2006.01)

(52) U.S. Cl.
CPC ............ *H01L 23/055* (2013.01); *H01L 23/06* (2013.01); *H01L 23/10* (2013.01); *H01L 23/49* (2013.01)

(58) Field of Classification Search
CPC ....... H01L 23/055; H01L 23/06; H01L 23/49; H01L 23/10
See application file for complete search history.

(56) References Cited

U.S. PATENT DOCUMENTS

2016/0155687 A1* 6/2016 Takizawa ............ H01L 21/4842
257/666
2018/0033761 A1* 2/2018 Watanabe .............. B23K 35/26

FOREIGN PATENT DOCUMENTS

| JP | H04-359550 A | 12/1992 |
| JP | 2005-327946 A | 11/2005 |
| JP | 2016-111028 A | 6/2016 |

* cited by examiner

*Primary Examiner* — Julia Slutsker
(74) *Attorney, Agent, or Firm* — Studebaker & Brackett PC

(57) ABSTRACT

A semiconductor apparatus includes: a case made of resin; an insert terminal including an external terminal portion embedded in the case and having a first terminal exposed from the case, and an internal terminal portion bent in a L shape with respect to a second terminal of the external terminal portion and having a first surface exposed from the case and an anchor part in close contact with the case; and a bonding wire bonded to the first surface of the internal terminal portion.

16 Claims, 16 Drawing Sheets

US 10,325,825 B2

SEMICONDUCTOR APPARATUS

BACKGROUND OF THE INVENTION

Field

The present invention relates to a semiconductor apparatus including a terminal insert case.

Background

In a conventional semiconductor apparatus wherein an insert terminal of a terminal insert case is wire-bonded, the terminal insert case has a structure in which part of the insert terminal is covered with a case made of resin and the insert terminal is integrally incorporated into the case. The incorporated insert terminal includes an external terminal portion and an internal terminal portion. The external terminal portion and the internal terminal portion are integrated via bending. The external terminal portion includes a fixed portion embedded in the case and an external connection portion, a distal end of which is exposed from the case so as to be electrically connectable to an external device. The internal terminal portion includes a bonding region on a top surface thereof exposed from the case so as to be wire-bondable. A technique for improving cohesion between the case and the internal terminal portion by providing a concave portion on the top surface of the internal terminal portion and covering the concave portion with the case is available (e.g., see JP 2016-111028 A).

SUMMARY

The wire-bonding to a bonding region of the internal terminal portion of the conventional semiconductor apparatus uses a technique whereby a wire bonding apparatus presses a bonding wire against the bonding region, causes ultrasound vibration to transmit and performs wire bonding using frictional heat thereby generated. When cohesion between the internal terminal portion and the case is low, the internal terminal portion vibrates according to ultrasound vibration, and so the frictional heat may not be stable, causing some parts to remain unbonded. As a countermeasure, since wire-bonding performance with respect to the bonding region is correlated with cohesion between the case and the internal terminal portion, it is possible to improve the wire bonding performance by improving the cohesion. The improvement of the wire bonding performance only improves reliability of the apparatus but also expands the selection range of the wire material or wire diameter.

In the conventional semiconductor apparatus, a concave portion is provided on the top surface of the internal terminal portion originally available as a bonding region and the concave portion is covered with the resin constituting the case to improve cohesion between the internal terminal portion and the case made of resin. Therefore, the area of the bonding region is reduced, resulting in a problem that the number of bonding wires that can be bonded to the bonding region is decreased. The decrease in the number of bonding wires may promote heat generation of the bonding wire during operation of the semiconductor apparatus, cause breakage of the bonding wire due to heat generation and cause reliability of the product to deteriorate. Note that in order to make up for the area of the reduced bonding region, it is necessary to increase the size of the insert terminal and increase the exposed area from the case. However, doing so may lead to an increase in the volume of the apparatus, resulting in a problem of being contrary to the size reduction of the apparatus.

The present invention has been implemented to solve the above-described problems and it is an object of the present invention to provide a semiconductor apparatus including a terminal insert case that improves cohesion between an internal terminal portion and a case and wire bonding performance with respect to the internal terminal portion without reducing a bonding region.

According to the present invention, a semiconductor apparatus includes: a case made of resin; an insert terminal including an external terminal portion embedded in the case and having a first terminal exposed from the case, and an internal terminal portion bent in a L shape with respect to a second terminal of the external terminal portion and having a first surface exposed from the case and an anchor part in close contact with the case; and a bonding wire bonded to the first surface of the internal terminal portion.

The present invention makes it possible to effectively secure an area of the bonding region and improve cohesion between the case and the internal terminal portion by the anchor part provided on the internal terminal portion.

Other and further objects, features and advantages of the invention will appear more fully from the following description.

DESCRIPTION OF EMBODIMENTS

First Embodiment

First, a configuration of a semiconductor apparatus 100 according to a first embodiment of the present invention.

Figure 1:
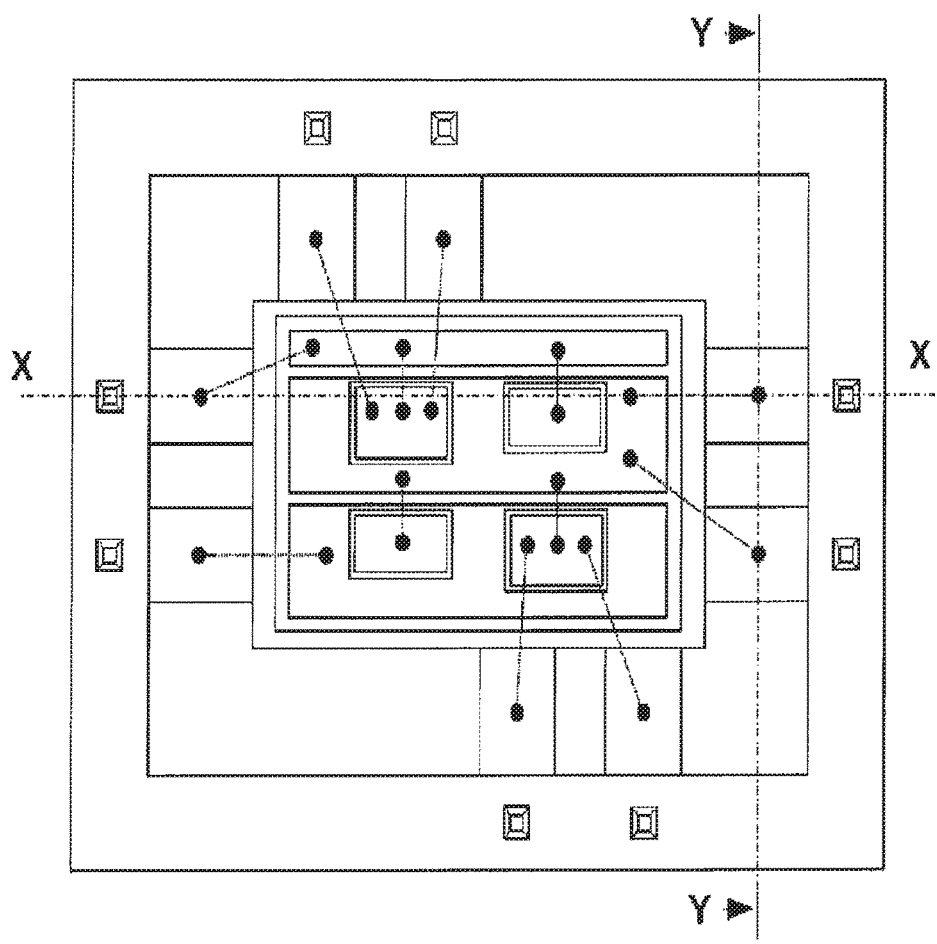
FIG. 1 is a configuration diagram of a semiconductor apparatus according to first to eight embodiments of the present invention.
Figure 2:
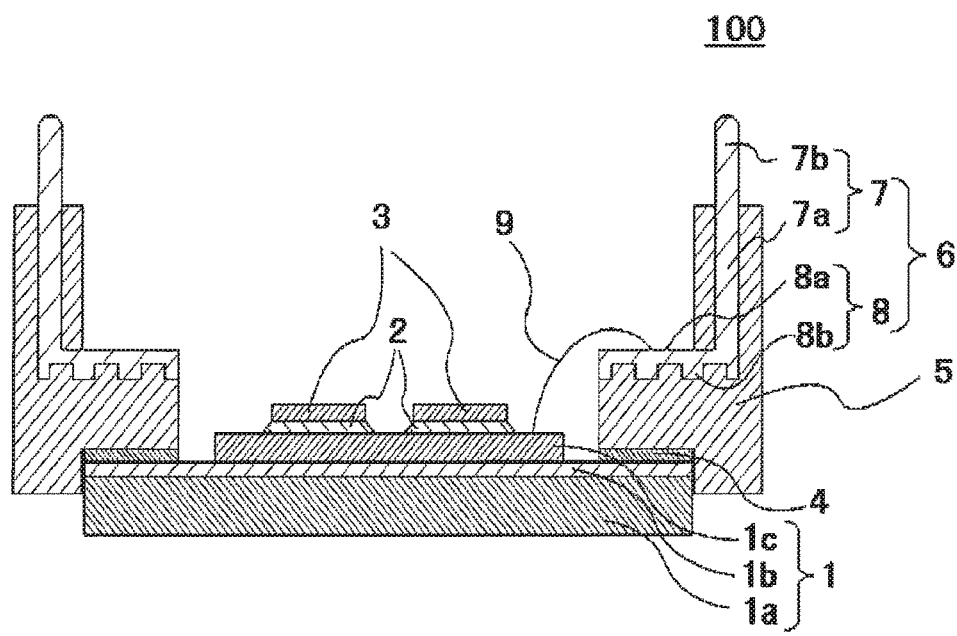
FIG. 2 is a cross-sectional view of the semiconductor apparatus according to the first embodiment of the present invention.

FIG. 1 is a configuration diagram of a semiconductor apparatus according to a first to third embodiments of the present invention. FIG. 2 is a cross-sectional view cut along a line X-X described in FIG. 1 and is a cross-sectional view of the semiconductor apparatus 100 according to the first embodiment. In FIG. 1 and FIG. 2, a sealing material charged into the semiconductor apparatus and an optionally provided cover are omitted. The sealing material and the cover will be likewise omitted in FIG. 3 and subsequent drawings.

The semiconductor apparatus 100 includes an integrated substrate 1 in which an electric circuit pattern 1c is mounted on a heat radiation plate 1a via an insulating layer 1b, a semiconductor device 3 bonded to the electric circuit pattern 1c via solder 2 and a terminal insert case provided so as to surround the integrated substrate 1 and bonded to the insulating layer 1b using an adhesive 4. The terminal insert case has a structure in which part of the insert terminal 6 is covered with a case 5 made of resin and the insert terminal 6 is thereby incorporated into the case 5. The incorporated insert terminal 6 includes an external terminal portion 7 and an internal terminal portion 8. The external terminal portion 7 and the internal terminal portion 8 are integrated via bending. The external terminal portion 7 includes a fixed portion 7a embedded in the case 5 and an external connection portion 7b exposed from the case 5. The internal terminal portion 8 includes a flat bonding region 8a on one surface thereof exposed from the case 5 so as to be wire-bondable. A plurality of recesses are provided as anchors on an interface with the case 5 and the other surface of the internal terminal portion 8 in series to an extending direction of the internal terminal portion 8. The recesses have a rectangular cross-sectional shape. Here, a concavo-convex part which is the anchor part formed of a plurality of recesses is called a "concave portion 8b." Note that although the concave portion 8b includes a plurality of recesses in the first embodiment, the concave portion including only one recess is likewise defined as the concave portion 8b. The concave portion 8b is covered with the case 5 made of thermoplastic resin represented by PPS. A bonding wire 9 is connected to the bonding region 8a. The bonding region 8a is connected to the semiconductor device 3 inside the apparatus and an energizing section constructed of the electric circuit pattern 1c via the bonding wires 9. Note that the inside of the semiconductor apparatus, a side face of which is constructed of the terminal insert case and a bottom surface of which is constructed of the integrated substrate 1, is sealed with a sealing material (not shown) which is an insulator.

Here, detailed dimensions of the internal terminal portion 8 including the concave portion 8b will be described. First, a thickness T of the internal terminal portion 8 is preferably 0.5 mm. When the thickness T is set to T<0.5 mm, rigidity of the terminal after forming the concavo-convex shape is low. When the thickness T is set to 3 mm<T, workability of the terminal may deteriorate and the size of the apparatus may be increased. Next, a recess width W of the concave portion 8b is preferably set to 0.5 mm. This is because when W<0.5 mm, resin which is to be charged in a post-process, liquefied and constituting the case 5 having viscosity may remain unfilled, while when 5 mm<W, the size of the apparatus may increase more than necessary. A recess depth H of the concave portion 8b is preferably set to 0.2 mm≤H≤ (T−0.3) mm. Setting 0.2 mm≤H may increase an anchor effect. The greater the recess depth H, the greater the anchor effect becomes, but too great a depth H may lower rigidity of the internal terminal portion 8. Therefore, an upper limit value needs to be a value that will not lead to insufficient rigidity of the internal terminal, and more specifically, the thickness of the thinnest part of the insert terminal 6 after the formation of the concave portion 8b is preferably not less than 0.3 mm.

Next, operations and effects of the concave portion 8b constituting the anchor portion of the internal terminal portion 8 provided for the semiconductor apparatus 100 according to the first embodiment will be described. The concave portion 8b provided in the internal terminal portion 8 is covered with the resin constituting the case 5. The concave portion 8b forms an interface perpendicular to the surface including the bonding region 8a on an interface between the case 5 and the internal terminal portion 8 and an anchor effect of suppressing movement of the internal terminal portion 8 in the horizontal direction and the vertical direction is generated on the interface in the vertical direction. Note that the horizontal direction described hereinafter means a direction parallel to the surface having the bonding region 8a and the vertical direction means a direction perpendicular to the surface having the bonding region 8a.

The anchor effect increases cohesion between the internal terminal portion 8 and the case 5. The improved cohesion suppresses movement and vibration of the internal terminal portion 8 due to ultrasound vibration during wire bonding and allows conversion from ultrasound vibration to frictional heat to be performed efficiently and stably, thus improving wire bonding performance with respect to the bonding region 8a. Since the concave portion 8b is provided on a surface opposite to the surface of the bonding region 8a, the concave portion 8b does not cause any reduction in size of the bonding region 8a. Note that flattening the top surface of the internal terminal can also eliminate the necessity for surface treatment such as plating for the bonding region 8a.

Figure 3:
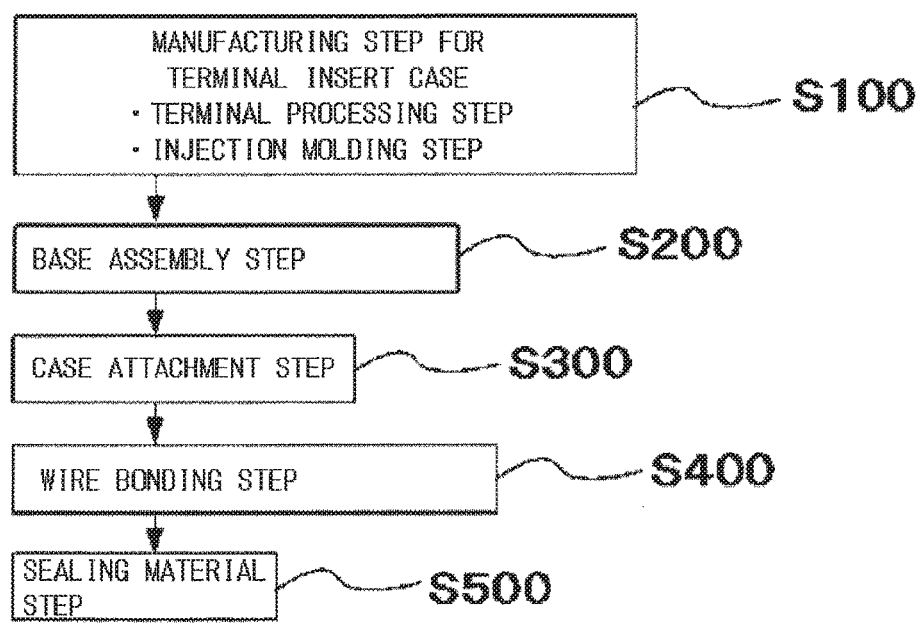
FIG. 3 is a manufacturing flowchart of the semiconductor apparatus according to the first embodiment of the present invention.

Next, a method of manufacturing the semiconductor apparatus 100 according to the first embodiment of the present invention will be described. FIG. 3 is a manufacturing flowchart of the semiconductor apparatus 100 according to the present first embodiment. The manufacturing method will be described in accordance with a sequence of the manufacturing flowchart.

A manufacturing step for the terminal insert case (S100) is divided into a terminal processing step and an injection molding step. The terminal processing step is a step of forming an outside shape of the terminal from a conductive plate member. Since a thickness of the plate member corresponds to a thickness of the terminal as is, the thickness of the plate member is determined in accordance with the amount of power conducted to the terminal. After determining the thickness of the plate member, the outside shape of the terminal is formed. The outside shape of the terminal is formed into an arbitrary terminal shape by mounting a premolded metal die on a press machine and pressing the metal die against the plate member. After that, bending is performed by pressing the plate member using a metal die for bending. Via bending, the terminal is formed into a shape in which the external terminal portion 7 and the internal terminal portion 8 are integrated via bending. The concave portion 8b provided in the internal terminal portion 8 may be formed by applying press work at a corresponding location in advance when the plate member is formed, whereas it is also possible to form the concave portion 8b simultaneously with the pressing when the outside shape is formed.

The concave portion 8b can also be formed through cutting work. When the concave portion 8b is formed through cutting work, it is possible to select a case where the concave portion 8b is cut in advance when the plate member is formed or a case where the concave portion 8*b* is cut after bending. Note that the concave portion 8*b* is formed by providing a plurality of recesses in any one or both of press work and cutting work. It is possible to provide a convex shape between the recesses by providing a plurality of recesses. In the first embodiment of the present invention, when the ratio of recesses to the surface on which the anchor is provided is ½ or more, the anchor portion is called a "convex portion."

Even when there is only one recess, it is possible to achieve an effect of improving the wire bonding performance, but it is preferable to provide a plurality of recesses. Note that terminal surface treatment steps such as plating and cleaning are omitted.

An injection molding step is a step of incorporating the terminal formed in the terminal processing step and to be inserted into the case 5 and molding the terminal. Injection molding is a method of forcing a liquid material to flow into a metal die formed into an arbitrary shape under an injection pressure, and solidifying the material by cooling the material to mold the material into a shape that matches with the metal die.

First, the material of the case 5 is heated to a high temperature, melted and liquefied. Next, a metal die including a cavity formed in accordance with the outside shape of the terminal insert case is prepared in advance and a required number of terminals formed in the terminal processing step are fixed to the cavity. While keeping the terminal fixed, the cavity of the metal die is filled with the liquefied resin, the resin is cooled until it is solidified and then taken out, and the terminal insert case is thereby molded. In consideration of takeout of the case 5 after the solidification, a molding method may also be used in which a plurality of upper/lower or left/right metal dies are combined and filled with resin that constitutes the case 5.

In the case of the terminal insert case used for the semiconductor apparatus according to the first embodiment of the present invention, a required number of terminals to be inserted, manufactured in the terminal processing step in advance are fixed to the metal die and injection-molded, whereas when there are many terminals and the terminals are set in the metal die many times, tie bar cutting may be performed in which a terminal to which a plurality of internal terminal distal ends are connected by a lead frame is manufactured in the terminal processing step and the lead frame is cut after the injection molding. However, in the case of tie bar cutting, when the lead frame is cut using a tie bar cutting metal die, stress may be applied such that the internal terminal portion 8 lifts and separates from the case 5, and so when tie bar cutting is performed, a cohesive force needs to be secured so that the internal terminal portion 8 does not move in a direction in which the internal terminal portion 8 moves away from the case 5, that is, in the vertical direction.

A base assembly step (S200) is a step of mounting the semiconductor device 3 on the integrated substrate 1. First, the integrated substrate 1 is prepared and the semiconductor device 3 is mounted on the electric circuit pattern 1*c* provided on the integrated substrate 1 via solder. Next, the solder is heated, melted and liquefied. After liquefying the solder 2, the whole semiconductor device 3 is cooled and the solder is solidified, and the semiconductor device 3 is thereby bonded to the electric circuit pattern 1*c* of the integrated substrate 1 via the solder.

A case attachment step (S300) is a step of attaching the terminal insert case to the semiconductor apparatus part manufactured in the base assembly step (S200). The adhesive 4 is applied in a ring shape to the surface of the insulating layer 1*b* of the integrated substrate 1 to which the semiconductor device 3 is bonded in the base assembly step (S200). The adhesive 4 has a thickness in which the adhesive 4 is applied to a whole circumference of the case 5 on the back surface of the terminal insert case when the terminal insert case is mounted on the integrated substrate 1. Applying the adhesive 4 having an optimum thickness to the whole circumference can prevent outflowing of a sealing material with which the interior of the semiconductor apparatus is sealed. Note that a thermosetting type adhesive is preferably used as the adhesive 4. The adhesive 4 is selected according to the purpose with water resistance, humidity resistance, chemical resistance, electric insulating property or the like taken into account. After the application of the adhesive 4, the terminal insert case is mounted on the integrated substrate 1, the adhesive 4 is acclimated, and then the adhesive 4 is hardened by heating and adhered.

A wire bonding step (S400) is a step of wiring the semiconductor apparatus part manufactured in the case attachment step (S300) and forming an electric circuit of the semiconductor apparatus. As the wire bonding apparatus, an apparatus is used in which frictional heat is generated through ultrasound vibration and the wire is heated and metal-bonded to a wire-bonding object. Wire bonding is performed by setting a wire in the wire bonding apparatus, pushing the wire at the location of the bonded part of the semiconductor apparatus part manufactured in the case attachment step (S300) and converting ultrasound vibration generated by the wire bonding apparatus to frictional heat. After the bonding, an extra wire is cut using a cutter provided in the wire bonding apparatus. The wire type is selected from gold, copper, aluminum or the like.

A sealing material step (S500) is a step of sealing the interior of the semiconductor apparatus part manufactured in the wire bonding step (S400) with a sealing material which is an insulator. After injecting a thermosetting type sealing material into the semiconductor apparatus using the case 5 of the semiconductor apparatus part manufactured in the wire bonding step (S400) as a side wall, and the integrated substrate 1 as a base, the sealing material is solidified by heating. The sealing material is selected according to the purpose with water resistance, humidity resistance, chemical resistance, electric insulating property or the like taken into account.

The present manufacturing flowchart does not describe steps which are arbitrarily performed such as a step of attaching a connector with connectivity with an external apparatus taken into account, a step of attaching a heat conductor or a step of attaching a cover.

Thus, in accordance with the semiconductor apparatus 100 according to the first embodiment of the present invention, by providing the concave portion 8*b* on a surface opposite to the surface including the bonding region 8*a* of the internal terminal portion 8, it is possible to improve cohesion between the internal terminal portion 8 and the case 5 and improve the wire bonding performance with respect to the bonding region 8*a* without reducing the number of wires that can be used for wire-bonding.

As the concave portion 8*b* provided in the internal terminal portion 8 of the semiconductor apparatus 100 according to the first embodiment of the present invention, a plurality of recesses are formed in series to the direction in which the internal terminal portion 8 extends, that is, the inward direction of the semiconductor apparatus. However, even when the plurality of recesses are formed parallel to the extending direction, the effect of improving cohesion between the case 5 and the internal terminal portion 8 can be achieved as in the case of the semiconductor apparatus 100 according to the first embodiment of the present invention. Similarly, it is also possible to form the plurality of recesses neither in parallel nor in series to the extending direction, that is, diagonally with respect to the extending direction. Note that the concave portion 8b can also be configured to have a checkered pattern, a diamond pattern or a cross pattern by combining recesses in series to the extending direction of the internal terminal portion 8, recesses parallel to the extending direction and recesses diagonal to the extending direction.

When the anchor portion is the convex portion described in paragraph 0017, it is preferable that the thickness T of the internal terminal portion 8 be 0.5 mm≤T≤3 mm, the recess width W of the concave portion 8b be 0.5 mm and the recess depth H be 0.2 mm for the reasons described in paragraph 0012.

Second Embodiment

Figure 4A:
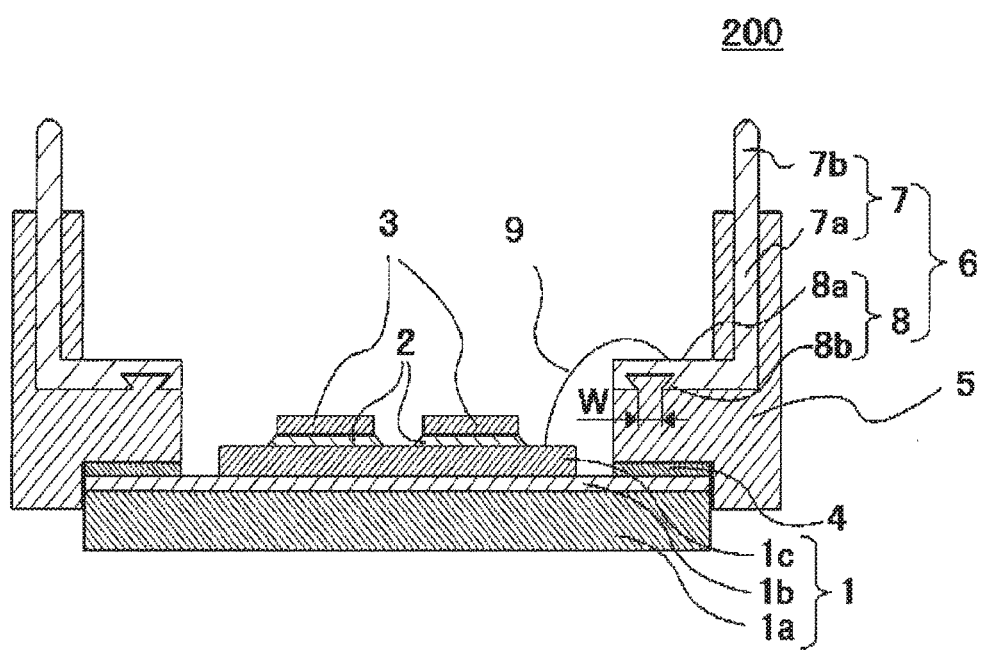
FIGS. 4A, 4B, 5A and 5B are cross-sectional views of a semiconductor apparatus according to a second embodiment of the present invention.
Figure 4B:
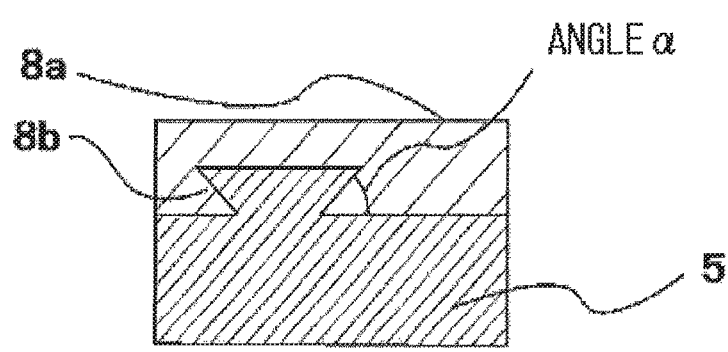

FIG. 4 is a cross-sectional view of a semiconductor apparatus 200 according to a second embodiment of the present invention. FIG. 4B is an enlarged view of the periphery of main parts described in FIG. 4A. In the semiconductor apparatus 100 according to the first embodiment, the anchor portion provided in the internal terminal portion 8 is formed of the concave portion 8b made up of a recess having a rectangular cross section, whereas in the semiconductor apparatus 200 according to the second embodiment, the anchor portion is formed of the concave portion 8b made up of a recess having a trapezoidal cross section. Note that in the second embodiment of the present invention, description of parts identical or corresponding to those in the first embodiment of the present invention is omitted.

The internal terminal portion 8 mounted on the semiconductor apparatus 200 according to the second embodiment of the present invention includes the flat bonding region 8a exposed from the case 5 so as to be wire-bondable on one surface of the internal terminal portion 8 and the concave portion 8b provided on an interface with the case 5 which is the other surface of the internal terminal portion 8. The concave portion 8b is a recess having a trapezoidal cross section and an opening width of the recess increases toward inside the internal terminal portion 8. The trapezoidal concave portion 8b is filled with the resin constituting the case 5. An angle α of an acute angle portion formed in the internal terminal portion 8 is within a range of 30°≤α<90°. The recess width W of the concave portion 8b described in the first embodiment corresponds to an opening width when the acute angle portions provided on both sides of the recess are connected by a straight line as described in FIG. 4 in the case of the concave portion 8b formed of a recess having a trapezoidal cross section according to the present second embodiment. For reasons similar to those of the first embodiment, the opening width W is preferably 0.5 mm≤W≤5 mm.

Next, operations and effects of the concave portion 8b formed of a recess having a trapezoidal cross section and provided in the semiconductor apparatus 200 according to the second embodiment will be described. Assuming 30°≤α<90°, it is possible to suppress deformation of the acute angle portion due to an injection pressure during molding and unfilling of the resin constituting the case 5 to the concave portion 8b formed of a recess having a trapezoidal cross section. The concave portion 8b formed of a recess having a trapezoidal cross section also has an anchor effect in the horizontal direction and can increase anchor effect in the vertical direction compared to the concave portion 8b formed of a recess having a rectangular cross section, that is, the concave portion 8b of the semiconductor apparatus according to the first embodiment. For this reason, it is effective to use the semiconductor apparatus according to the present embodiment when stress to the internal terminal portion 8 in the vertical direction is generated as in the case of the semiconductor apparatus including a terminal insert case wherein the aforementioned tie bar cutting is performed.

The concave portion 8b formed of a recess having a trapezoidal cross section of the semiconductor apparatus 200 according to the second embodiment can also be formed through press work, but the concave portion 8b is preferably formed through cutting work from the standpoint of workability.

Figure 5A:
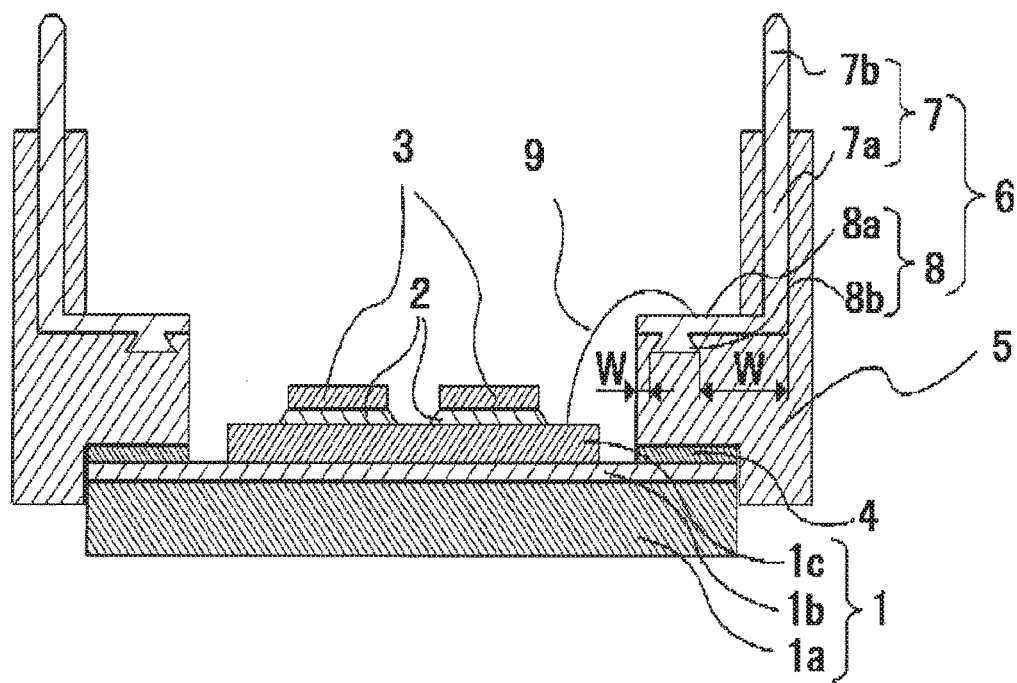
Figure 5B:
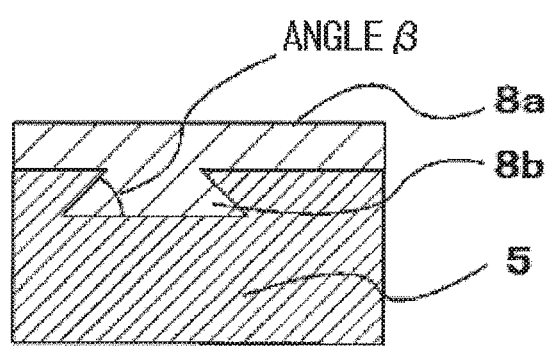

When the semiconductor apparatus according to the second embodiment of the present invention is provided with the concave portion 8b including a protrusion having a trapezoidal cross section, a protrusion width of which increases toward outside the internal terminal portion 8 between recesses as shown in FIG. 5, the semiconductor apparatus provides similar anchor effects. For the same reason as the above-described reason, an angle β of an acute angle portion formed in the internal terminal portion 8 is preferably within a range of 30°≤β<90°. A recess width W of the concave portion 8b corresponds to a horizontal distance from both ends of the internal terminal portion 8 to the acute angle portion of the protrusion having a trapezoidal cross section as shown in FIG. 5. The opening width W is preferably 0.5 mm≤W≤5 mm for the same reason as the reason in the first embodiment.

Thus, the semiconductor apparatus 200 according to the second embodiment of the present invention is provided with the concave portion 8b formed of a recess having a trapezoidal cross section on a surface different from the surface having the bonding region 8a of the internal terminal portion 8. It is thereby possible to improve cohesion between the internal terminal portion 8 and the case 5 and thereby improve wire bonding performance without reducing the number of wires that can be bonded to the bonding region 8a.

Third Embodiment

Figure 6A:
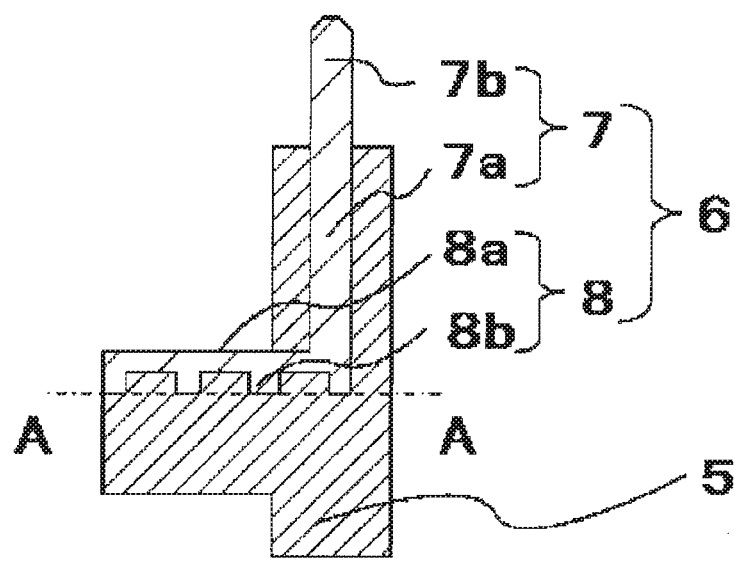
FIGS. 6A and 6B are cross-sectional views of main parts of a semiconductor apparatus according to a third embodiment of the present invention.
Figure 6B:
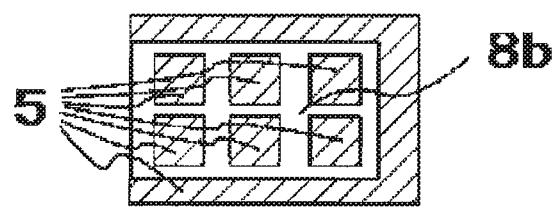

FIG. 6 is a cross-sectional view of main parts of a semiconductor apparatus according to a third embodiment of the present invention. FIG. 6B illustrates a cross-sectional view cut along a line A-A described in FIG. 6A. In the first embodiment, the concave portions 8b provided in the internal terminal portion 8 are formed in parallel to the extending direction of the internal terminal portion 8 or in series to the extending direction, whereas in the semiconductor apparatus 300 according to the present embodiment, the concave portions 8b are provided in a grid pattern as shown in FIG. 6B. Note that in the third embodiment of the present invention, description of parts identical or corresponding to those in the first embodiment of the present invention is omitted.

Next, operations and effects of the concave portions 8b provided in a grid pattern in the anchor portion of the internal terminal portion 8 of the insert terminal 6 of the semiconductor apparatus 300 according to the third embodiment will be described. The concave portions 8b provided in a grid pattern can increase the area of an interface between resin formed in the vertical direction and the internal terminal portion 8 and can also increase the anchor effect between the resin and the internal terminal portion 8.

Thus, the semiconductor apparatus 300 according to the third embodiment of the present invention is provided with the concave portions 8b which are arranged in a grid pattern on the surface opposite to the surface including the bonding region 8a of the internal terminal portion 8. It is thereby possible to improve cohesion between the internal terminal portion 8 and the case 5 and thereby improve wire bonding performance without reducing the number of wires that can be bonded to the bonding region 8a.

Fourth Embodiment

Figure 7:
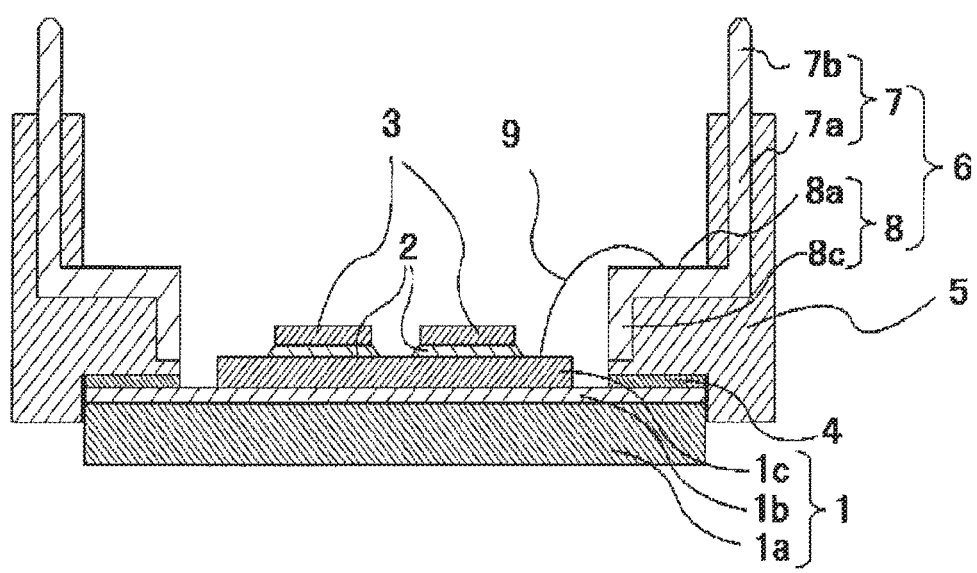
FIGS. 7, 8A and 8B are cross-sectional views of a semiconductor apparatus according to a fourth embodiment of the present invention.

FIG. 7 is a cross-sectional view of a semiconductor apparatus 400 according to a fourth embodiment of the present invention. FIG. 7 is a cross-sectional view cut along the line X-X described in FIG. 1. While in the first embodiment, the anchor portion provided on the surface in contact with the case 5 of the internal terminal portion 8 is designated as the concave portion 8b, in the semiconductor apparatus 400 according to the fourth embodiment, a first bent portion 8c formed of bending in the extending direction of the internal terminal portion 8 functions as the anchor portion. The first bent portion 8c is provided in the aforementioned terminal processing step. Note that in the fourth embodiment of the present invention, description of parts identical or corresponding to those in the first embodiment of the present invention is omitted.

In the semiconductor apparatus 400 according to the fourth embodiment, the anchor portion is constructed of the first bent portion 8c which is provided in the extending direction of the internal terminal portion 8 and bent so as to be covered with the case 5.

Next, operations and effects of the first bent portion 8c of the internal terminal portion 8 provided in the semiconductor apparatus 400 according to the fourth embodiment will be described. The first bent portion 8c is provided in the extending direction of the internal terminal portion 8 and bent so as to be covered with the case 5. An anchor effect of suppressing vibration in the horizontal direction and the vertical direction of the internal terminal portion 8 is generated on the interface between the first bent portion 8c and the case 5. The anchor effect causes the internal terminal portion 8 and the case 5 to be fixed in close contact with each other and improves wire bonding performance with respect to the bonding region 8a. Since the first bent portion 8c is provided on a surface different from the surface including the bonding region 8a, the size of the bonding region 8a is not reduced.

Figure 8A:
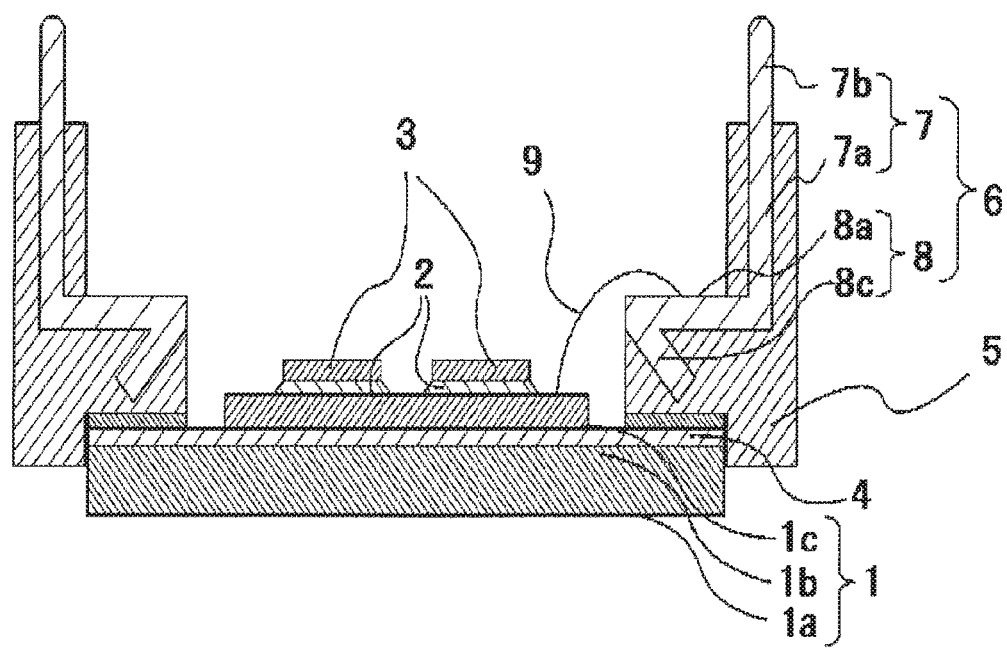
Figure 8B:
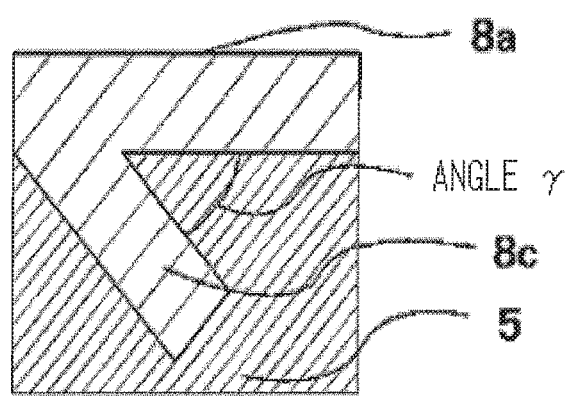

The first bent portion 8c provided in the extending direction of the internal terminal portion 8 of the semiconductor apparatus 400 according to the fourth embodiment of the present invention is bent at a right angle with respect to the surface including the bonding region 8a in FIG. 7, whereas as shown in FIG. 8, it is also possible to bend the first bent portion 8c at an angle less than 90 degrees. Here, FIG. 8B is an enlarged view of the periphery of main parts described in FIG. 8A. Bending the first bent portion 8c at an angle less than 90 degrees makes it possible to increase the anchor effect in the vertical direction, increase the area of the interface between the first bent portion 8c and the case 5 and further improve cohesion between the case 5 and the internal terminal portion 8, and thereby improve wire bonding performance. When an interior angle γ of the bending is set to less than 15°, resin unfilling may occur and no anchor effect may be achieved. Therefore, the interior angle γ of the bending of the internal terminal portion 8 of the insert terminal 6 of the semiconductor apparatus according to the present embodiment is preferably 15°≤γ≤90°.

Fifth Embodiment

Figure 9:
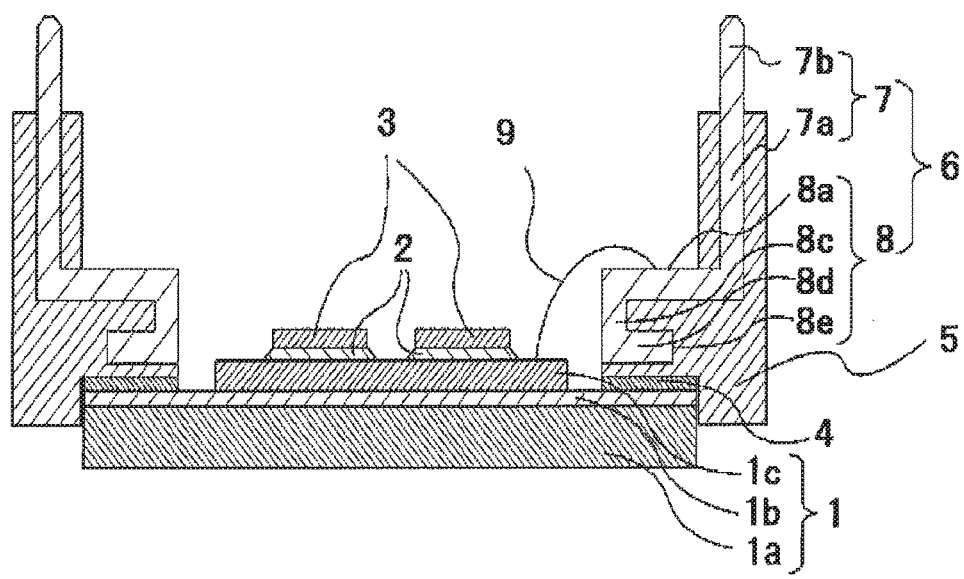
FIG. 9 is a cross-sectional view of a semiconductor apparatus according to a fifth embodiment of the present invention.

FIG. 9 is a cross-sectional view of a semiconductor apparatus 500 according to a fifth embodiment of the present invention. FIG. 9 is also a cross-sectional view cut along the line X-X described in FIG. 1. The semiconductor apparatus according to the fourth embodiment includes the first bent portion 8c in the internal terminal portion 8, whereas in the semiconductor apparatus 500 according to the fifth embodiment of the present invention, the internal terminal portion 8 further includes a second bent portion 8d in addition to the first bent portion 8c. In the fifth embodiment of the present invention, description of parts identical or corresponding to those in the fourth embodiment of the present invention is omitted.

The second bent portion 8d of the internal terminal portion 8 of the semiconductor apparatus 500 according to the fifth embodiment of the present invention is formed in the terminal processing step in the same way as in the first bent portion 8c. As in the case of the semiconductor apparatus 400 according to the fourth embodiment, the first bent portion 8c is bent with one surface thereof being flush with the surface of the case 5 and the other surface being covered with the resin constituting the case 5. The second bent portion 8d is further covered with the resin constituting the case 5 via bending toward the extending direction more than the first bent portion 8c. The second bent portion 8d may be bent at an angle that satisfies two conditions: that an end face 8e of the second bent portion 8d should not be exposed from the case 5; and that the inside of the internal terminal portion 8 formed into a U shape through the first bending and the second bending should be filled with the resin constituting the case 5.

Next, operations and effects of the semiconductor apparatus 500 according to the fifth embodiment will be described. The semiconductor apparatus 500 can obtain an anchor effect generated at two anchor portions of the first bent portion 8c and the second bent portion 8d. The anchor effect obtained at the first bent portion 8c is similar to that of the semiconductor apparatus 400 according to the fourth embodiment, whereas the anchor effect obtained at the second bent portion 8d is greater because the second bent portion 8d is covered with the resin constituting the case 5. The semiconductor apparatus 500 according to the fifth embodiment of the present invention can easily secure a wide area of the interface between the case 5 and the internal terminal portion 8 through the first bent portion 8c and the second bent portion 8d. Securing the wide interface can enhance the anchor effect of suppressing movement of the internal terminal portion 8 in the horizontal direction and in the vertical direction. As described so far, the internal terminal portion 8 and the case 5 are fixed in close contact with each other and wire bonding performance with respect to the bonding region 8a improves. Since the first bent portion 8c is provided on a surface different from the bonding region 8a, the size of the bonding region 8a is not reduced.

Sixth Embodiment

Figure 10A:
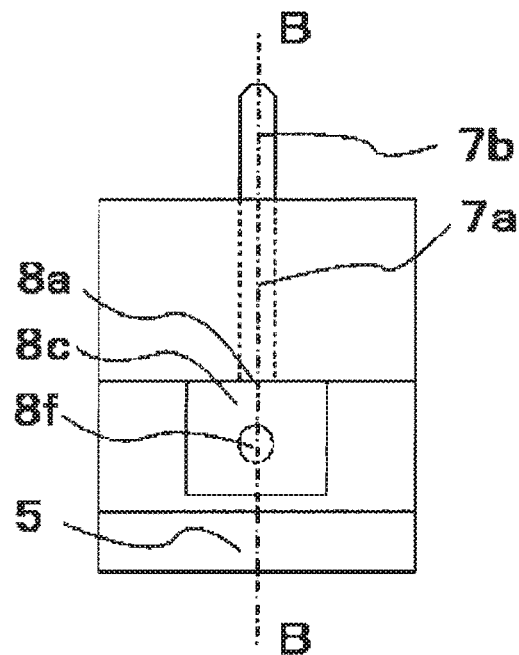
FIGS. 10A and 10B are cross-sectional views of main parts of a semiconductor apparatus according to a sixth embodiment of the present invention.
Figure 10B:
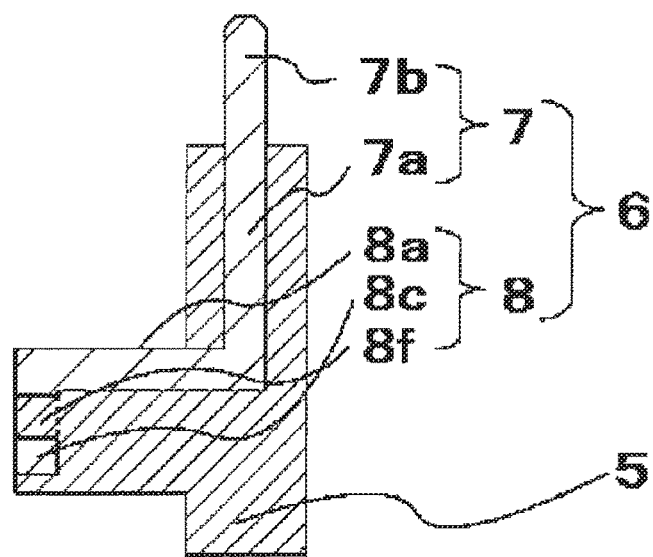

FIG. 10 is a cross-sectional view of main parts of a semiconductor apparatus according to a sixth embodiment of the present invention. FIG. 10B illustrates a cross-sectional view cut along a line B-B described in FIG. 10A. The semiconductor apparatus according to the present embodiment has a structure in which a through hole 8f is formed in the first bent portion 8c of the semiconductor apparatus according to the fourth embodiment. Note that in the sixth embodiment of the present invention, description of parts identical or corresponding to those in the fourth embodiment of the present invention is omitted.

The internal terminal portion 8 mounted on the semiconductor apparatus according to the sixth embodiment of the present invention includes the through hole 8f in the first bent portion 8c. The through hole 8f is formed in the terminal processing step and the interior of the through hole 8f is filled with the resin constituting the case 5, and the resin constituting the case 5 filling the interior of the through hole 8f and the exposed surface from the case 5 of the first bent portion 8c form the same surface. The size and shape of the through hole 8f can be freely designed as long as the through hole 8f allows the interior of the through hole 8f to be filled with the resin constituting the case 5.

Operations and effects of the first bent portion 8c including the through hole 8f of the internal terminal portion 8 provided in the semiconductor apparatus according to the sixth embodiment will be described. The through hole 8f of the semiconductor apparatus according to the sixth embodiment of the present invention is filled with the resin constituting the case 5 and an interface with the case 5 is formed in the through hole 8f. This interface particularly generates an anchor effect of suppressing movement of the internal terminal portion 8 in the vertical direction. This anchor effect causes the internal terminal portion 8 and the case 5 to be fixed in close contact with each other and thereby improves wire bonding performance with respect to the bonding region 8a. Furthermore, since the first bent portion 8c including the through hole 8f is provided on a surface different from the bonding region 8a, the size of the bonding region 8a is not reduced.

The semiconductor apparatus according to the sixth embodiment includes one through hole 8f, but a plurality of through holes 8f may also be provided. Providing the plurality of through holes 8f can expand the area of the interface between the terminal portion 8 and the case 5 and increase the anchor effect.

Seventh Embodiment

Figure 11:
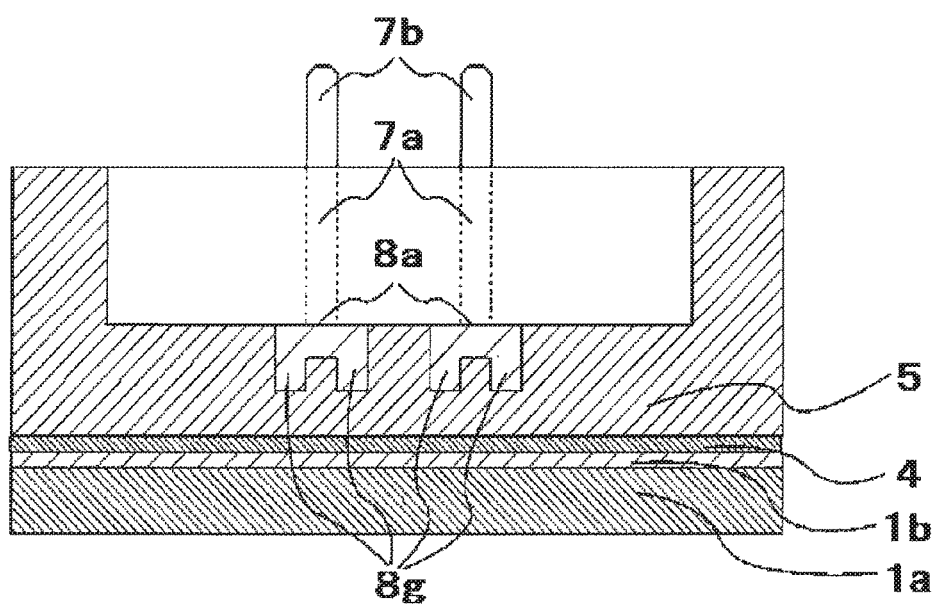
FIGS. 11, 13A, 13B, 15A and 15B are cross-sectional views of a semiconductor apparatus according to a seventh embodiment of the present invention.
Figure 12:
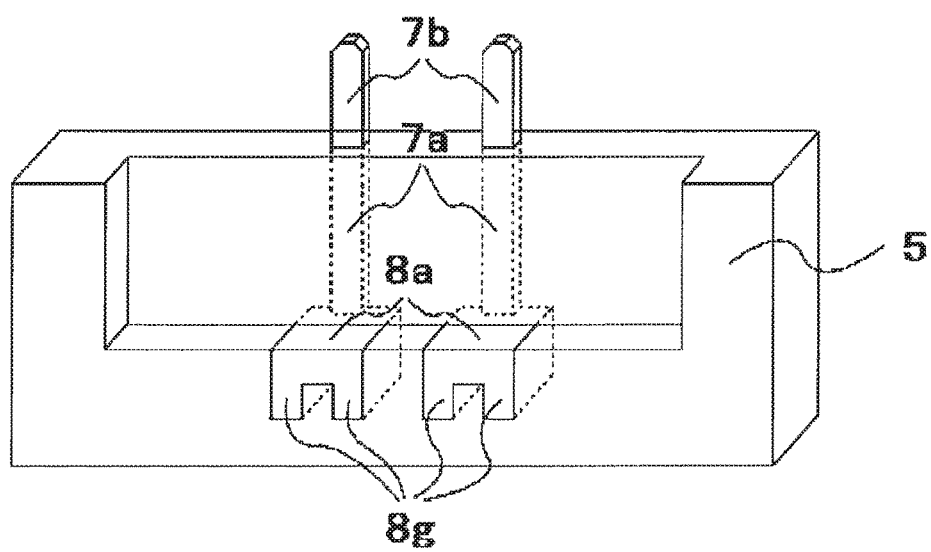
FIGS. 12, 14 and 16 are perspective views of main parts of a semiconductor apparatus according to a seventh embodiment of the present invention.

FIG. 11 is a cross-sectional view of a semiconductor apparatus according to a seventh embodiment of the present invention. FIG. 11 is a cross-sectional view along a line Y-Y described in FIG. 1 and FIG. 12 is a perspective view of a periphery of main parts. In the semiconductor apparatus according to the seventh embodiment, an anchor portion at a bent portion is formed in the same way as in the fourth embodiment. However, the seventh embodiment differs from the fourth embodiment in the position in which the bent portion is formed. The bent portion is provided on the side face side of the internal terminal portion 8 in the seventh embodiment. Note that in the seventh embodiment of the present invention, description of parts identical or corresponding to those in the fourth embodiment of the present invention is omitted.

In the semiconductor apparatus according to the seventh embodiment, side face bent portions 8g are provided through bending on the side face side of the internal terminal portion 8. The side face bent portions 8g are covered with the resin constituting the case 5.

Next, operations and effects of the side face bent portions 8g provided in the semiconductor apparatus according to the seventh embodiment will be described. The side face bent portions 8g can be formed at two locations on the side faces of the internal terminal portion 8. The side face bent portions 8g are covered with the resin constituting the case 5, it is thereby possible to form an interface between the case 5 and the internal terminal portion 8. The formation of the interface produces an anchor effect, making it possible to improve cohesion between the case 5 and the internal terminal portion 8 and improve wire bonding performance with respect to the internal terminal portion 8.

Furthermore, since the side face bent portions 8g are provided on a surface different from the bonding region 8a, the side face bent portions 8g do not reduce the size of the bonding region 8a.

Figure 13A:
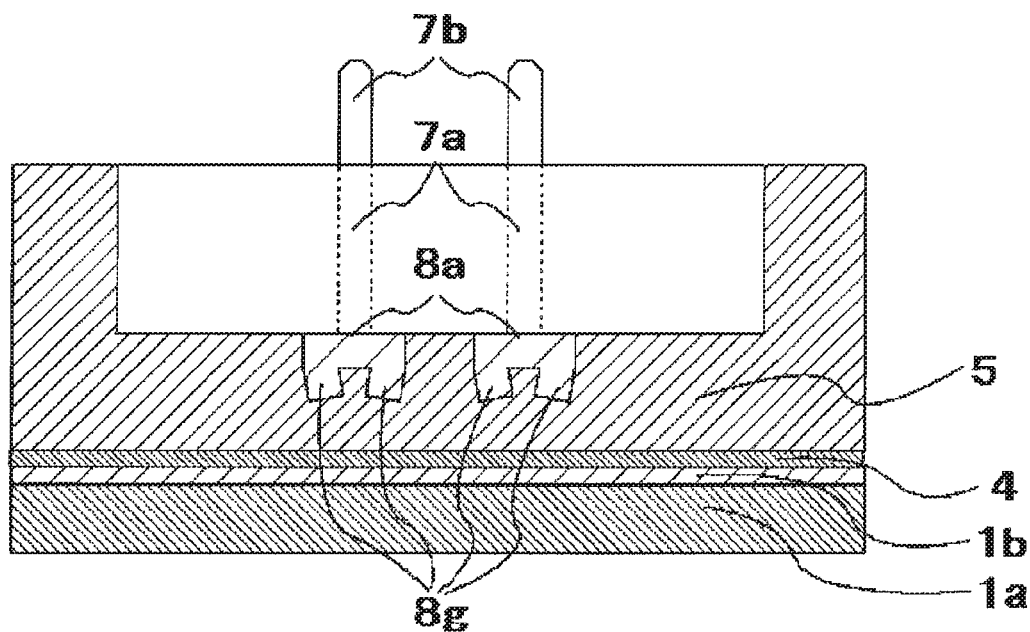
Figure 13B:
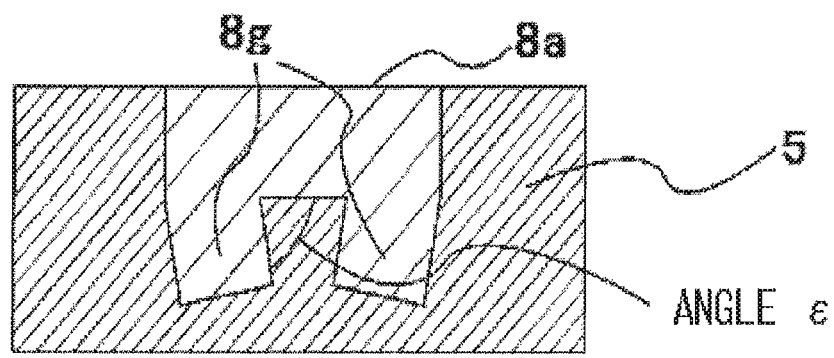
Figure 14:
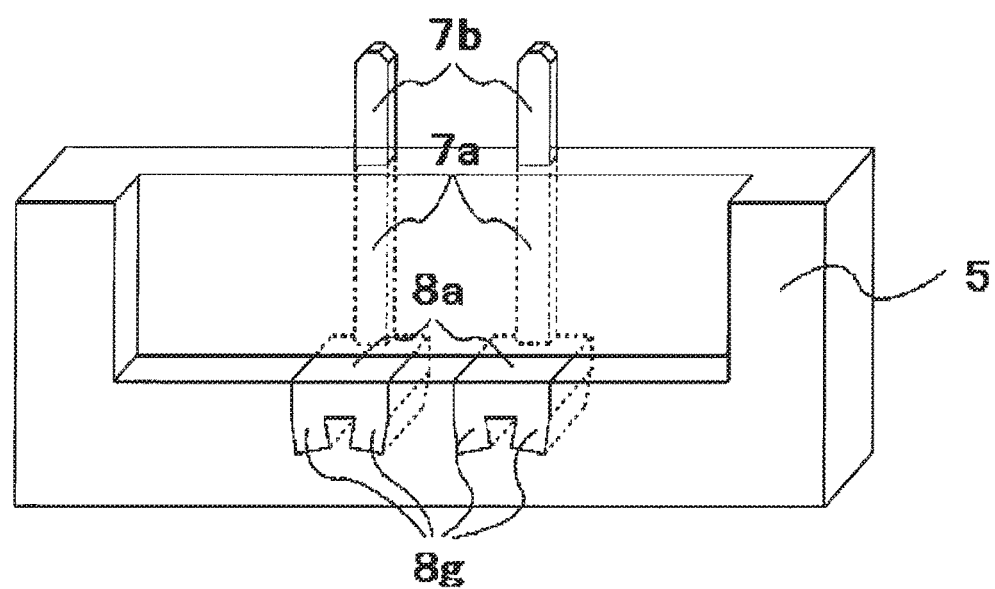
Figure 15A:
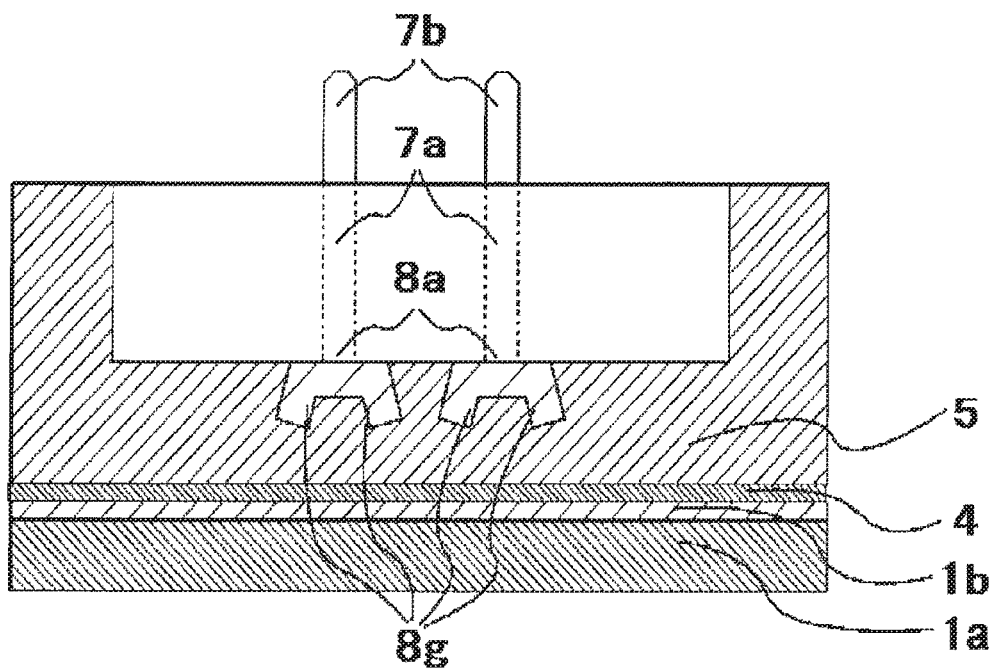
Figure 15B:
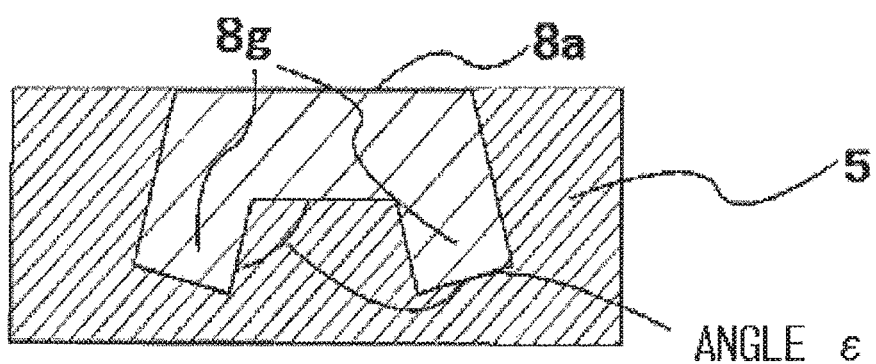
Figure 16:
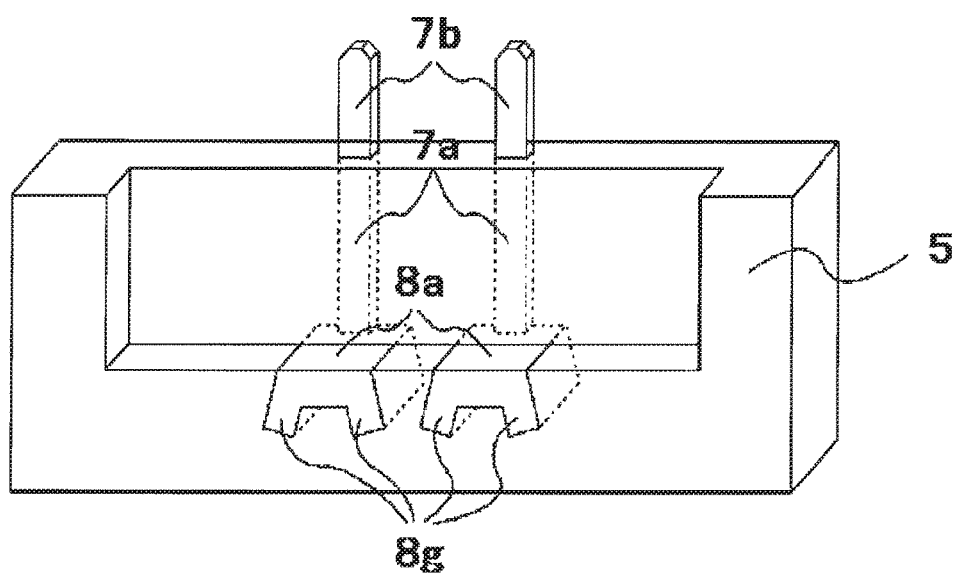

In the semiconductor apparatus according to the seventh embodiment of the present invention, the side face bent portions 8g are bent toward a direction perpendicular to the surface of the bonding region 8a as shown in FIG. 12. However, the side face bent portions 8g can also be bent inclined from the vertical direction as shown in FIG. 13 and FIG. 15. FIG. 13B and FIG. 15B are enlarged views of the main parts in FIG. 13A and FIG. 15A. FIG. 14 is a perspective view in the periphery of the main parts corresponding to FIG. 13. FIG. 16 is a perspective view in the periphery of the main parts corresponding to FIG. 15. With the side face bent portion 8g being inclined and bent, it is possible to suppress movement in the vertical direction due to vibration of the internal terminal portion 8 and further improve cohesion between the case 5 and the internal terminal portion 8. Moreover, since an angle ε formed with respect to the wire bonding surface is configured to be $30°≤ε≤150°$, it is possible to suppress unfilling of the resin and upsizing of the apparatus.

In the semiconductor apparatus 700 according to the seventh embodiment of the present invention, the side face bent portions 8g are provided on two side faces of the internal terminal portion 8. However, since an effect of improving the wire bonding performance can be provided even when the side face bent portions 8g are provided only on one side face of the internal terminal portion 8. Thus, it is possible to select whether the side face bent portions 8g are provided on only one side or both sides of the internal terminal portion 8 depending on required wire bonding performance.

Eighth Embodiment

Figure 17A:
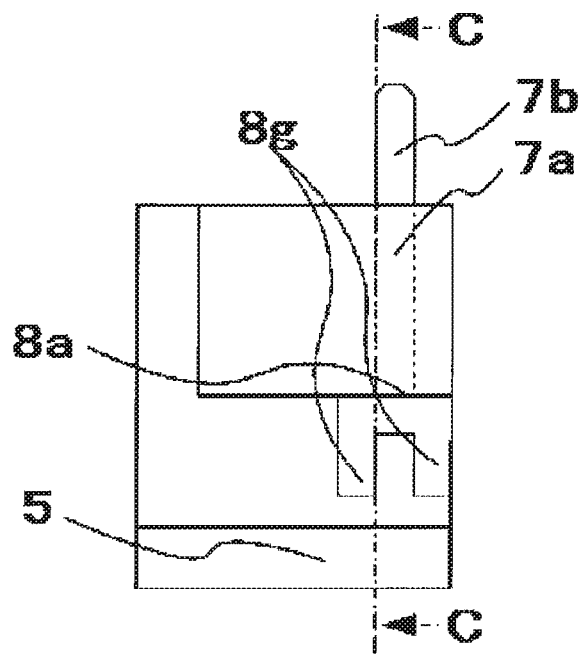
FIGS. 17A and 17B are cross-sectional views of main parts of a semiconductor apparatus according to an eighth embodiment of the present invention.
Figure 17B:
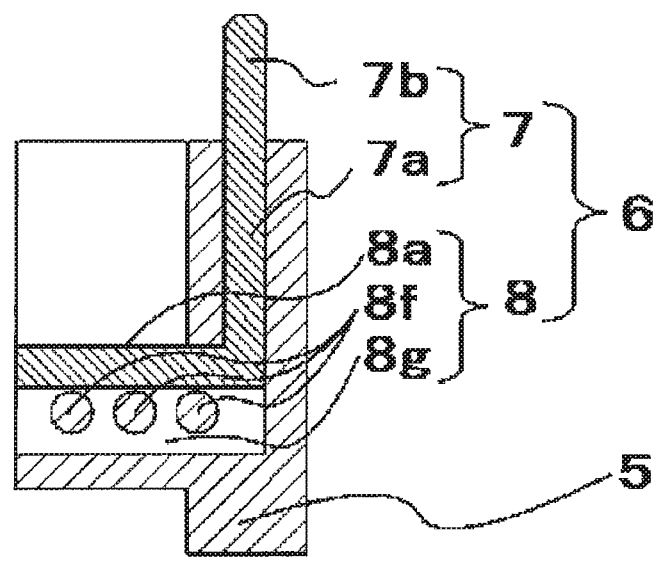

FIG. 17 is a cross-sectional view of main parts of a semiconductor apparatus 800 according to an eighth embodiment of the present invention. The semiconductor apparatus 800 according to the present embodiment has a structure in which through holes 8f are formed in the side face bent portion 8g of the semiconductor apparatus according to the seventh embodiment. Note that in the eighth embodiment of the present invention, description of parts identical or corresponding to those in the seventh embodiment of the present invention is omitted.

The internal terminal portion 8 mounted on the semiconductor apparatus according to the eighth embodiment of the present invention includes the through holes 8f in the side face bent portion 8g. The through holes 8f are formed in the terminal processing step and the interiors of the through hole 8f are filled with the resin constituting the case 5. The size and shape of the through holes 8f can be freely designed as long as the through holes 8f allow the interiors of the through holes 8f to be filled with the resin constituting the case 5.

Next, operations and effects of the side face bent portion 8g including the through holes 8f provided in the semiconductor apparatus according to the eighth embodiment will be described. The through holes 8f of the semiconductor apparatus according to the eighth embodiment of the present invention are filled with the resin constituting the case 5 and an interface with the case 5 is formed in the through holes 8f. This interface particularly produces an anchor effect of suppressing movement of the internal terminal portion 8 in the vertical direction. This anchor effect causes the internal terminal portion 8 and the case 5 to be fixed in close contact with each other and thereby improves wire bonding performance with respect to the bonding region 8a. Furthermore, since side face bent portion 8g including the through holes 8f is provided on a surface different from the surface of the bonding region 8a, the size of the bonding region 8a is not reduced.

In the first to eighth embodiments of the present invention, the semiconductor device 3 may also be made of SiC. Since the SiC semiconductor device has a higher thermal conductivity than a Si semiconductor device, a semiconductor apparatus using the SiC semiconductor device can be used for a high temperature operation compared to the Si semiconductor apparatus. One of concerns about shortening of a product life caused by a high temperature operation is wire breakage due to Joule's heat when the apparatus is in operation, whereas in the semiconductor apparatus of the present invention, the number of wires for wire bonding to the internal terminal portion 8 is increased and Joule's heat can thereby be suppressed, which can contribute to improvement of reliability when the semiconductor device 3 is constructed of an SiC semiconductor device.

In the first to eighth embodiments of the present invention, the integrated substrate 1 can be constructed of the heat radiation plate 1a, the electric circuit pattern 1c and the insulating layer 1b. For example, the integrated substrate 1 may be constructed of the heat radiation plate 1a and an insulating substrate, on one surface of the insulating layer 1b of which the electric circuit pattern 1c is formed and on the other surface of the insulating layer 1b of which a metal plate is mounted, and the metal plate and the heat radiation plate 1a may be fixed by the solder 2.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2017-190984, filed on Sep. 29, 2017 including specification, claims, drawings and summary, on which the Convention priority of the present application is based, is incorporated herein by reference in its entirety.

The invention claimed is:

1. A semiconductor apparatus comprising:
   a case made of resin;
   an insert terminal including an external terminal portion embedded in the case and having a first terminal exposed from the case, and an internal terminal portion bent in an L shape with respect to a second terminal of the external terminal portion, the internal terminal portion having a first surface exposed from the case and an anchor portion, the anchor portion being in close contact with the case and including one of:
   a concave portion provided on a second surface of the internal terminal portion that faces in a direction opposite to a direction in which the first surface faces, and
   a convex portion provided on the second surface of the internal terminal portion that faces in the direction opposite to the direction in which the first surface faces; and
   a bonding wire bonded to the first surface of the internal terminal portion.

2. The semiconductor apparatus according to claim 1, wherein the anchor portion includes the concave portion provided on the second surface of the internal terminal portion.

3. The semiconductor apparatus according to claim 2, wherein the concave portion is a recess having a rectangular cross section.

4. The semiconductor apparatus according to claim 2, wherein the concave portion is a recess having a trapezoidal cross section.

5. The semiconductor apparatus according to claim 3, wherein a thickness T of the internal terminal portion is 0.5 mm≤T≤3.0 mm,
   a recess width W of the concave portion is 0.5 mm≤W≤5 mm, and
   a recess depth H of the concave portion is 0.2 mm≤H≤(T−0.3)mm.

6. The semiconductor apparatus according to claim 2, wherein the concave portion includes a plurality of recesses provided in a grid pattern.

7. The semiconductor apparatus according to claim 1, wherein the anchor portion includes the convex portion provided on the second surface of the internal terminal portion.

8. The semiconductor apparatus according to claim 7, wherein a protrusion of the convex portion has a trapezoidal cross section.

9. The semiconductor apparatus according to claim 1, further comprising a semiconductor device made of SiC in the case.

10. A semiconductor apparatus comprising:
    a case made of resin;
    an insert terminal including an external terminal portion embedded in the case and having a first terminal exposed from the case, and an internal terminal portion bent in an L shape with respect to a second terminal of the external terminal portion and having a first surface exposed from the case and an anchor portion in close contact with the case, and
    a bonding wire bonded to the first surface of the internal terminal portion,
    wherein the anchor portion is a first bent portion provided in an extending direction of the internal terminal portion and bent to be embedded in the case.

11. The semiconductor apparatus according to claim 10, wherein the first bent portion is bent so that an angle γ between the first bent portion and the first surface of the internal terminal portion is 15°≤γ≤90°.

12. The semiconductor apparatus according to claim 10, wherein the anchor portion further includes:
    a second bent portion bending toward the extending direction more than the first bent portion and covered with a resin constituting the case.

13. The semiconductor apparatus according to claim 10, wherein the first bent portion includes a through hole, and the through hole is filled with a resin constituting the case.

14. A semiconductor apparatus comprising:

a case made of resin;

an insert terminal including an external terminal portion embedded in the case and having a first terminal exposed from the case, and an internal terminal portion bent in an L shape with respect to a second terminal of the external terminal portion and having a first surface exposed from the case and an anchor portion in close contact with the case; and a bonding wire bonded to the first surface of the internal terminal portion, wherein the anchor portion is a side face bent portion provided on a side face side of the internal terminal portion and bent to be embedded in the case.

15. The semiconductor apparatus according to claim 14, wherein the side face bent portion is bent so that an angle $\varepsilon$ between the side face bent portion and the first surface of the internal terminal portion is $30° \leq \varepsilon \leq 150°$.

16. The semiconductor apparatus according to claim 14, wherein the side face bent portion includes a through hole, and the through hole is filled with a resin constituting the case.

\* \* \* \* \*